(12) United States Patent
Mintchev et al.

(10) Patent No.: US 7,126,431 B2
(45) Date of Patent: Oct. 24, 2006

(54) DIFFERENTIAL DELAY CELL HAVING CONTROLLABLE AMPLITUDE OUTPUT

(75) Inventors: Svilen Mintchev, San Jose, CA (US); Oleksiy Zabroda, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 21 days.

(21) Appl. No.: 10/999,585

(22) Filed: Nov. 30, 2004

(65) Prior Publication Data

US 2006/0114044 A1     Jun. 1, 2006

(51) Int. Cl.
*H03B 5/24* (2006.01)
*H03H 11/20* (2006.01)

(52) U.S. Cl. .......................................... 331/57; 327/246
(58) Field of Classification Search .................. 331/57, 331/106, 116 R, 175, 177 R, 182, 183; 327/231, 327/240, 246, 247, 250–253, 256–257
See application file for complete search history.

(56) References Cited

U.S. PATENT DOCUMENTS 5,638,030 A * 6/1997 Du .............................. 331/57

OTHER PUBLICATIONS

Johns, David and Ken Martin. *Analog Integrated Circuit Design*. Published by John Wiley and Sons, Inc.: New York, 1997, pp. 1-2.
Maneatis, John G. "Low-Jitter Process-Independent DLL and PLL Based on Self-BiasedTechniques", IEEE Journal of Solid-State Circuits, vol. 31, No. 11, Nov. 1996, pp. 1723-1732.

* cited by examiner

*Primary Examiner*—David Mis
(74) *Attorney, Agent, or Firm*—Lisa K. Jorgenson; Renee Michelle Leveque

(57) ABSTRACT

A differential delay cell includes a current source for establishing an operating current and a differentially coupled transistor pair having a common node, two input nodes, and two output nodes. The common node is coupled to the current source, and the two output nodes are coupled to an impedance load. The impedance load establishes a time delay between each of the input nodes and a corresponding one of the output nodes. Differential output signals are generated at said two output nodes in response to input signals coupled to said two input nodes. An amplitude control device is coupled between the two output nodes for controlling an amplitude of the differential output signals being generated.

28 Claims, 8 Drawing Sheets

DIFFERENTIAL DELAY CELL HAVING CONTROLLABLE AMPLITUDE OUTPUT

BACKGROUND

With the advances in the SoC (System on Chip) designs and the continuously increasing complexity and speed of the digital parts in such designs, the task for the synchronization of data paths and the sampling clock is becoming more challenging. Not less important is also the necessity of synthesizing clock signals having frequencies significantly higher than the frequency of a stable external reference clock.

All of these applications require the use of a PLL (Phase Lock Loop), which can be easily integrated in current digital CMOS processes. The VCO (Voltage Controlled Oscillator) for such PLLs can be implemented in the most straightforward manner using ring-oscillators. Ring-oscillators are composed of delay cells connected in a ring and in this case the frequency of oscillation is described by the formula:

$$F_{osc} = \frac{1}{2NT_{del}} \quad \text{(Equation 1)}$$

where

N—the number of delay cells in the ring $T_{del}$—input-output delay of each cell Due to the high switching activity in the modern designs, there is a lot of noise coupled in the PLL's VCO through the substrate of the chip and from the supply rails. This is why the design of the delay cell should be immune towards these noise sources. Usually, delay cells employ a fully differential architecture. One such prior art differential delay cell 10 is shown in FIG. 1. The differential delay cell 10 is implemented using PMOS transistors 14 and 15. Inputs IN1 and IN2 are connected to the gates of the PMOS transistors 14 and 15, respectively. The drains of the PMOS transistors 14 and 15 are connected to a pair of resistive loads 17 comprising resistors 19 and 18, respectively. The sources of transistors 14 and 15 are connected together with one terminal 12 of a bias current source 11.

The differential delay cell 10 distributes the current of the bias current source 11 between the resistors 18 and 19 proportionally to the voltage difference at the inputs IN1 and IN2. Ideally, the output impedance of the bias current source 11 is high. This isolates the differential delay cell 10 from noise present on the power supply rail SUPL. The noise from substrate and ground is coupled equally to outputs OUT1 and OUT2. Since a differential delay cell can react only on the difference of the input signals, the next differential delay cell in the ring rejects these common mode noise signals.

The delay of the differential delay cell 10 is proportional to a time constant determined at its outputs. The value of the time constant is defined by the product of the resistance at the output, and the total lumped capacitance at the output to ground. If the value of the resistors 18 and 19 could be changed, it would be possible to change the delay time of the differential delay cell 10, and thus force the ring-oscillator work at a controlled frequency.

A practical realization of this concept is shown in prior art FIG. 2. Differential delay cell 10 is essentially a fully differential amplifier stage loaded with symmetrical loads 22. The combination of NMOS transistor 23 and diode connected NMOS transistor 24 emulates the resistive load of FIG. 1, whose value can be controlled by voltage $V_{ctrl}$ present at the gate of NMOS transistor 23. A control circuit 21 adjusts the current of PMOS transistor 25 such that the upper limit of the voltage at the outputs OUT1 and OUT2 is equal to the control voltage $V_{ctrl}$ applied to the input of an amplitude control operational amplifier 28. The amplitude control operational amplifier 28 works in a negative feedback configuration with a replica of one-half of the differential delay cell 10, represented as delay cell 29. The delay of delay cell 29 is also controlled by $V_{ctrl}$ and is reversely proportional to it.

It is desirable to obtain higher frequencies from the ring oscillator. This can be achieved in the prior art differential delay cell by the way of reducing the effective load resistance of the differential delay cell either by keeping the same amplitude of oscillation and respectively increasing the current, or by reducing the amplitude of oscillation without substantial increase of the current. However, to be able to oscillate, the differential delay cell should have the product of the transconductance of the input PMOS transistors 26 or 27 and the effective load resistance to be substantially greater than 1. Both ways of achieving higher frequency, as described above, demand higher input transistor transconductance. To achieve higher input transistor transconductance in the prior art requires that the width of the input transistors have to be large. This substantially increases the load capacitance associated with the outputs OUT1 and OUT2 and leads either to slowing down the VCO or burning an additional current to reach the desired frequency.

Therefore it is desirable to have the amplitude of the output voltage of the differential delay cell to be independent of the control voltage controlling the delay, which will linearize the transfer characteristic of the VCO.

It is also desirable to provide a means to increase the sensitivity of the differential delay cell towards the change of the differential voltage at its inputs, and to further reduce the amplitude of the oscillation for a differential delay cell. This would reduce the transition time and increase the frequency of the oscillation for the same bias current and load capacitance.

BRIEF DESCRIPTION OF THE DRAWINGS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description, like reference numerals are used to describe the same, similar or corresponding parts in the several views of the drawings.

DETAILED DESCRIPTION

Figure 3:
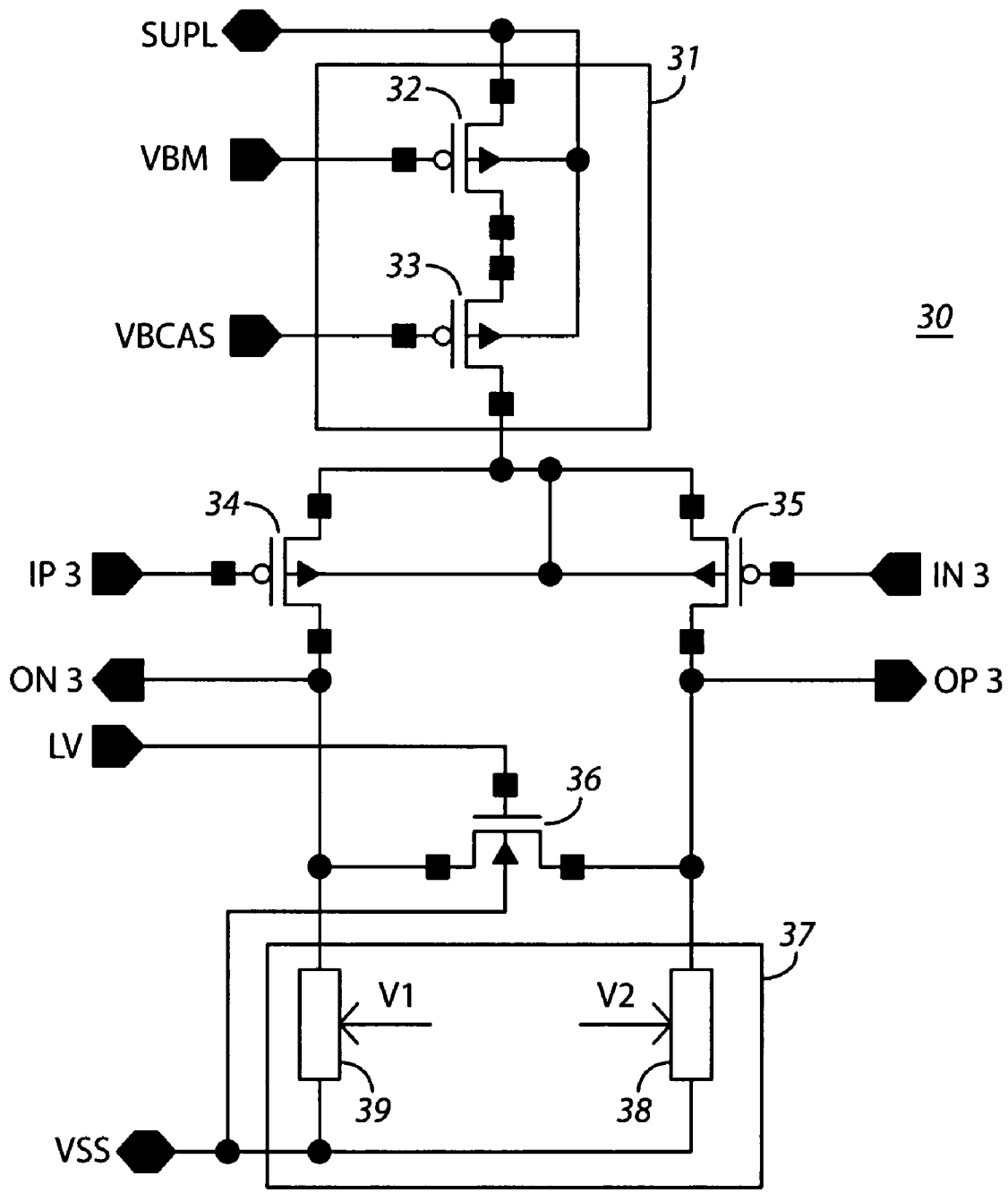
FIG. 3 is an electrical diagram of a differential delay cell in accordance with one embodiment of the present invention.

FIG. 3 is an electrical diagram of a differential delay cell 30 in accordance with one embodiment of the present invention. A cascode current source 31 consisting of two PMOS transistors, transistors 32 and 33. The transistors 32 and 33 are arranged in series isolates the differential delay cell 30 from noise generated on the power supply rail SUPL. The gate of transistor 32 receives a control voltage VBM, which is used to modify the delay of differential delay cell 30. The gate of transistor 33 is coupled to a bias voltage source VBCAS that places transistor 33 in an active region over the range of control voltages VBM applied to the gate of transistor 32. The bias current generated by the cascode current source 31 is distributed in two PMOS transistors, transistors 34 and 35 in relation to the voltage difference of their gate voltages IP3 and IN3, respectively. A controllable impedance load 37 includes a variable load element 39 coupled Vss and to the drain of transistor 34 thereby forming output ON3, and a variable load element 38 also coupled to Vss and the drain of transistor 35 forming thereby output OP3. An amplitude control device, hereinafter referred to as an amplitude control transistor 36 also couples between output ON3 and output OP3. The amplitude control device is an NMOS transistor, the gate of which is connected to an amplitude control voltage LV.

The controllable impedance load 37 can be implemented in various forms. The variable load elements 38 and 39 can be either gate-controlled transistors emulating the resistive loads described above, or active transistor loads, which will be described below. In FIG. 3, the variable load elements 38 and 39 are shown to have different control voltages V2 and V1, respectively, however it will be appreciated that the control voltages V1 and V2 can be set to be the same control voltage.

Regardless of the type of variable load elements utilized, the amplitude control transistor 36 functions the same. Control voltage LV is chosen such that the amplitude control transistor 36 is in an OFF state when the voltages of the differential delay cell outputs OP3 or ON3 are approximately equal to each other. When the voltage at either output OP3 or ON3 drops low enough to turn amplitude control transistor 36 ON, the amplitude control transistor 36 starts to conduct the current from the output having the higher voltage to the one with the lower voltage, thus operating as a voltage clamp. In this case the amplitude of oscillation can be controlled independently of the cascode current source 31 current and what is more important, for the same values of variable load elements, the frequency of oscillation is higher compared to the prior art differential delay cell presented in FIG. 2.

The additional means of control of the oscillation amplitude using the amplitude control device provides an opportunity to obtain virtually any desirable value of the VCO cell gain regardless of the value of the current provided by cascode current source 31 and the transconductance of the transistors forming the variable load elements.

Thus there is no need to increase the size of the input transistors 34 and 35 within the differential delay cell 30 or the value of the current generated by the cascode current source 31 to make a VCO oscillate at higher frequencies. The amplitude control utilized in the present invention provides the advantage of choosing these values optimally while saving on power consumption and chip area.

Figure 4:
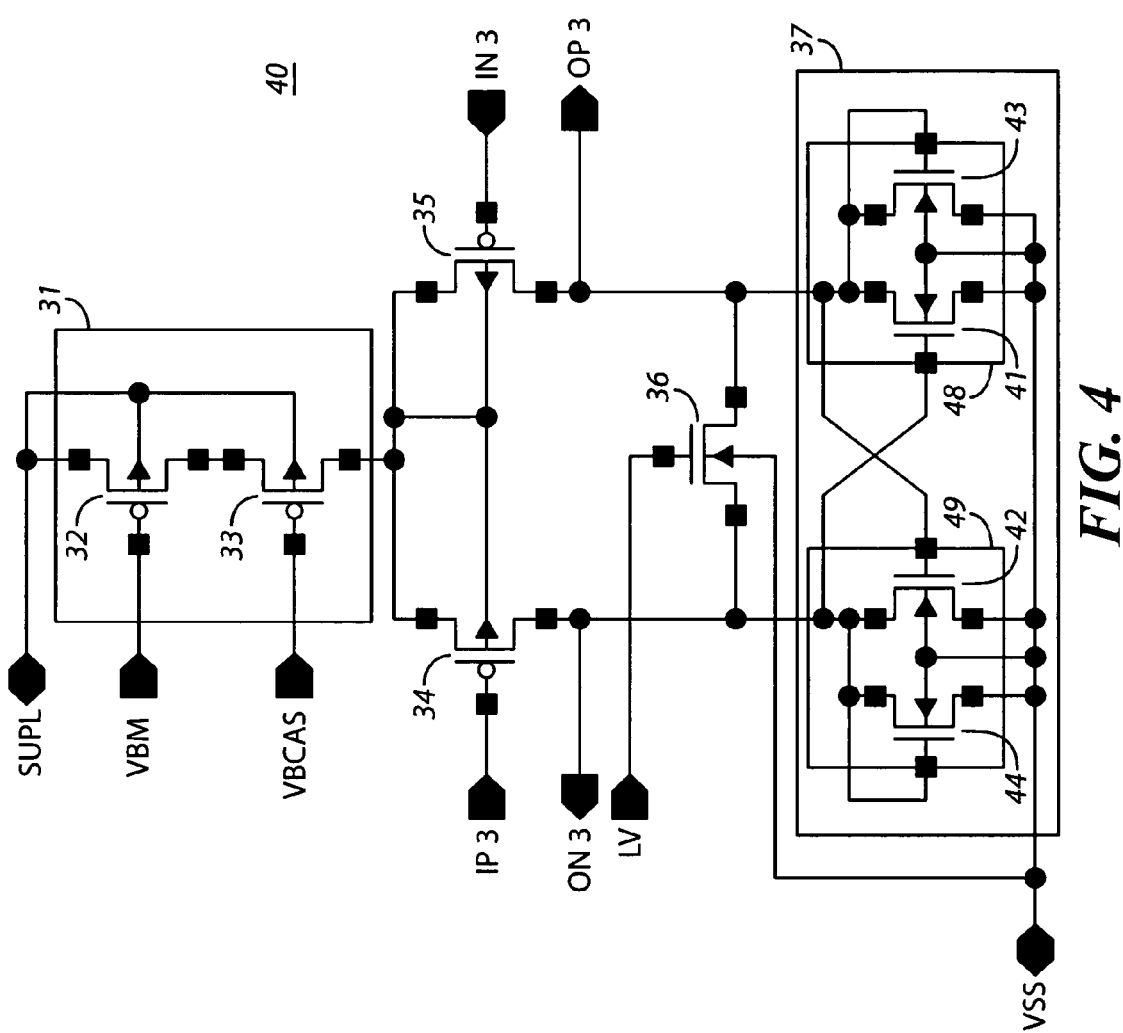
FIG. 4 is an electrical diagram of a differential delay cell in accordance with an alternate embodiment of the present invention.

FIG. 4 is an electrical diagram of a differential delay cell 40 in accordance with an alternate embodiment of the present invention. A controllable impedance load 37 is implemented as a pair of variable load elements 48 and 49 comprising cross-coupled transistors 41 and 42 shunted by diode connected transistors 43 and 44, respectively. Transistors 41, 42, 43, and 44 are implemented in the present invention using NMOS transistors.

By itself, the cross-coupled transistor pair comprising cross-coupled transistors 41 and 42 represents a positive feedback configuration, which has a regenerative action. The cross-coupled transistor pair also represents a negative impedance when looking between the drains of transistors 41 and 42. When transistors 41 and 42 are both in saturation during the transition from one state to the other, the diode connected transistors 43 and 44, respectively, introduce a positive value of impedance to the output nodes ON3 and OP3 of the differential delay cell 40. Varying the ratio of the sizes of the cross coupled NMOS transistors 41 and 42 and diode connected NMOS transistors 43 and 44 make it is possible to set virtually any desirable value to the output impedance, both positive and negative.

Figure 1:
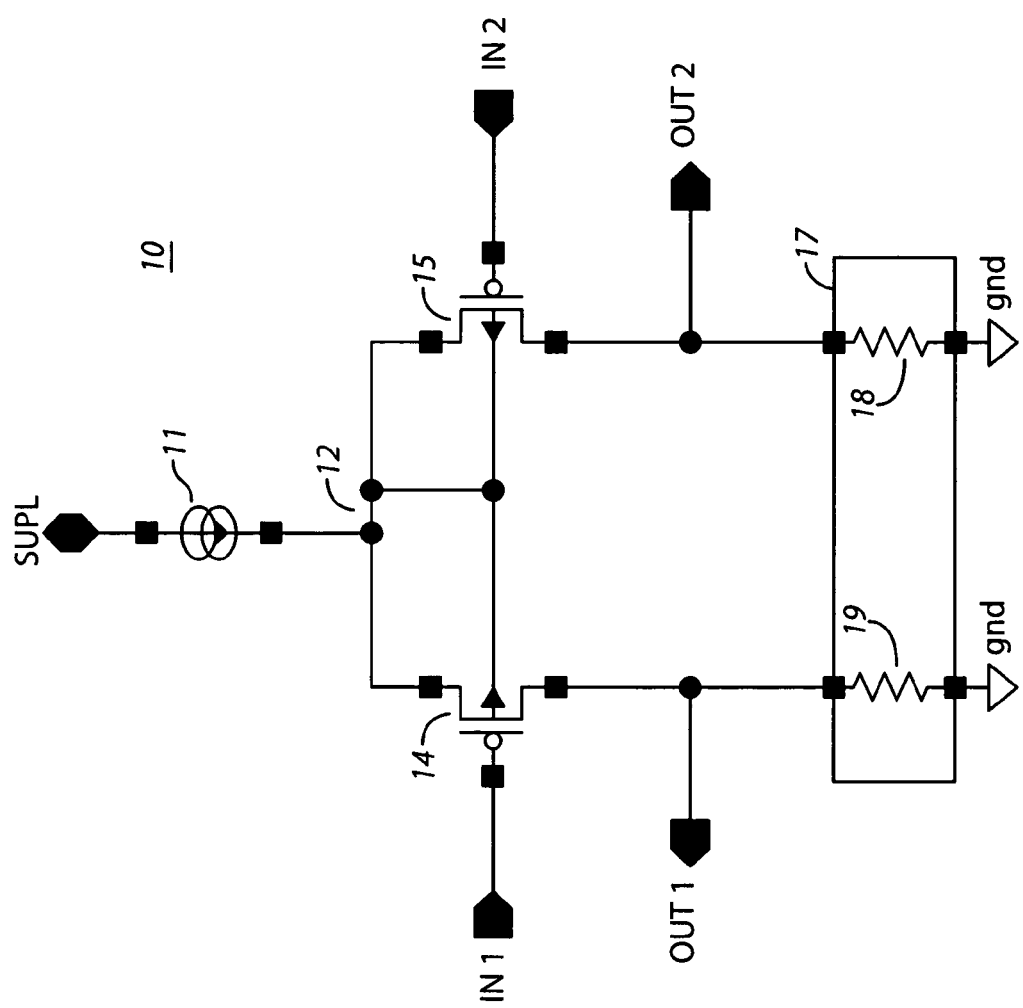
FIG. 1 is an electrical diagram of a prior art differential delay cell.
Figure 2:
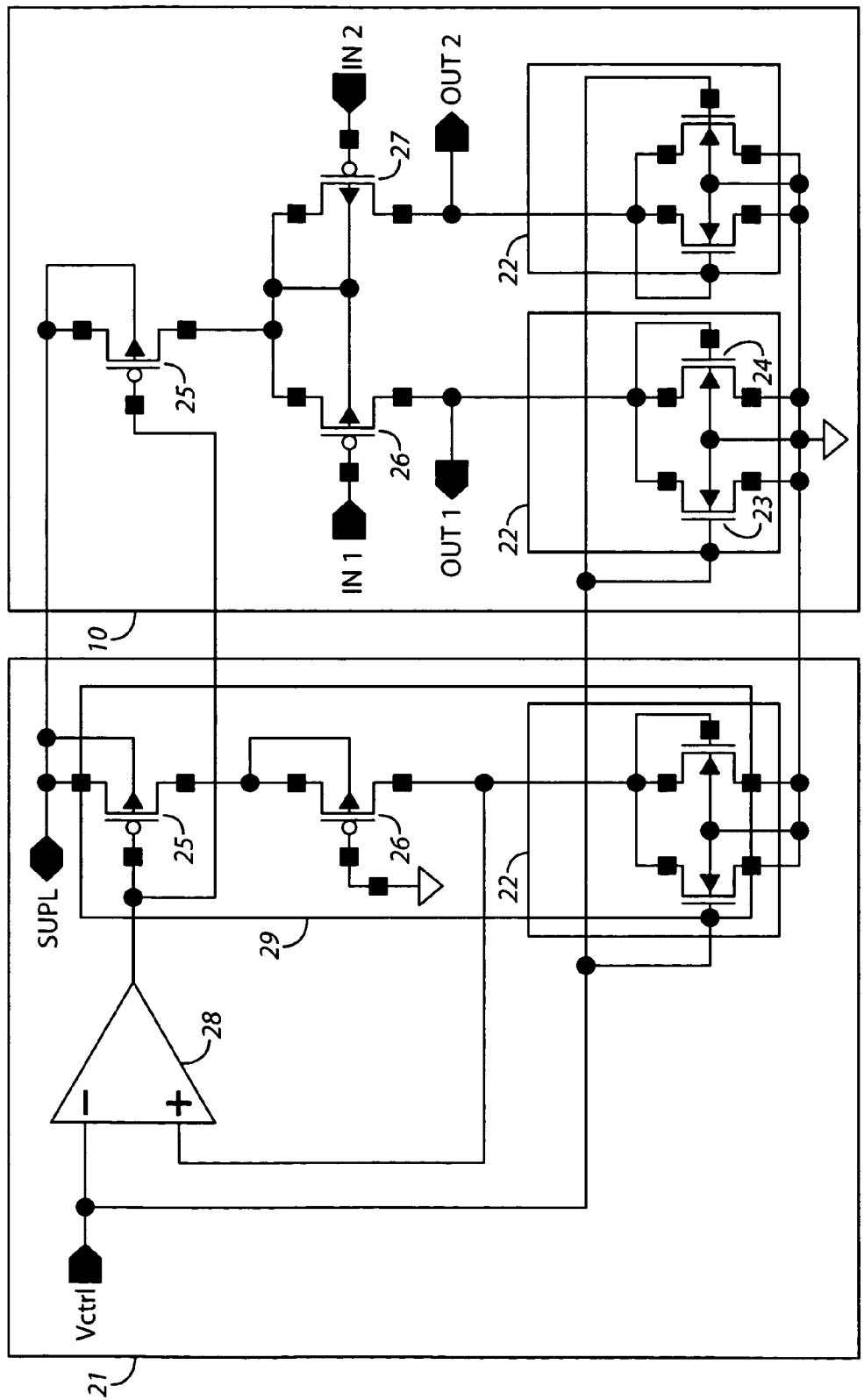
FIG. 2 is an electrical diagram of a control circuit suitable for use with the prior art differential delay cell.

This impedance variation would affect significantly the frequency of the prior art differential delay cell of FIG. 2, where the delay time is proportional to the product of the output impedance and capacitance, and the performance would be significantly corrupted when the effective value of the output impedance becomes negative. For instance, when the gate of transistor 41 becomes more positive than the drain, which is also connected to the gate of transistor 42, will result in a decrease in drain voltage for transistor 41. This in turn will cause transistor 42 to become less conductive and will result in an increase in the drain voltage of transistor 42, such that the gate of transistor 41 becomes even more positive. This regenerative action would result in transistor 41 being completely ON and transistor 42 being completely OFF where the amplitude control transistor 36 not present. When the amplitude control transistor 36 is not present, the cross-coupled transistors 41 and 42 would latch into such a state and it would take a significant delay to switch them around.

The amplitude control transistor 36, which gate voltage is nominally constant, substantially improves the time to change states. When the gate voltage of this transistor is high enough, it will present a conductive path and will deteriorate the positive feedback loop gain of the cross-coupled pair 37.

It will be appreciated that when the gate of transistor 35 is lower in voltage with respect to the gate of transistor 34, then transistor 35 will be set to conduct a greater portion of the current of the cascode current source 31. In this case the drain of transistor 35, which is also the output OP3, will be pulled higher with respect to the midpoint when gate voltage of transistors 34 and 35 are equal. Respectively, the drain of transistor 34, which is connected to the output ON3, will be pulled lower with respect to the midpoint. When the voltage at the gate of amplitude control transistor 36 is more than one threshold higher with respect to the drain of transistor 34, then amplitude control transistor 36 will be set up to conduct part or all of the current of transistor 35. Since in this situation the gate of transistor 42 is connected to a higher voltage compared to the gate of transistor 41, its drain-source path will be more conductive than the drain-source path of transistor 41. When it is assumed that in the extreme case, transistor 41 is not conducting and the effect of the diode connected transistors in the circuit is not considered, then transistor 42 and amplitude control transistor 36 form a circuit configuration which presents an effective impedance connected to pin OP3 having a positive value defined approximately as $$Z_{e\!f\!f} = \frac{1}{g_{m_{41}}} \qquad \text{(Equation 2)}$$

where $Z_{eff}$ is the effective impedance, and
$g_m$ is the transconductance of transistor 42 assuming that transistor 36 and 42 still work in the saturation region. When the effective impedance is positive, this will be a significantly more stable situation compared to the case when the amplitude control transistor 36 is not present and the cross-coupled pair 37 introduced a negative resistance. Asserting a nominally constant voltage at the gate of amplitude control transistor 36 will determine the voltage at its source and thus the drain-source voltage of the amplitude control transistor 36. For a given size of transistors 41 and 42 it is now possible to control the output voltage amplitude by changing the voltage at the gate of amplitude control transistor 36.

When the voltages at the gates of transistors 34 and 35 start switching, e.g. the gate voltage of transistor 34 becomes more negative with respect to the gate voltage of transistor 35, then the drain current of transistor 35 decreases and that of transistor 34 increases. This also causes a decrease in the current going through the amplitude control transistor 36. The increasing current of transistor 34 will pump charge in the capacitance associated with the drain of transistor 34, which is also the gate of transistor 41. Thus the gate of transistor 41 rises, reducing the value of the transconductance of the amplitude control transistor 36 (turning off this transistor is possible too) because its gate is connected to a nominally constant voltage. The circuit enters a mode of operation, which very much resembles the one when amplitude control transistor 36 was not present. In this mode the gain of the differential delay cell 40 is established by the product of the transconductance of input transistors 34 and 35 and the effective output impedance, which is set by the size ratio of cross coupled transistors 41 and 42 and diode connected transistors 43 and 44, respectively. When the widths of cross-coupled transistors 41 and 42 are greater than one of the diode connected transistors 43 and 44, respectively, the regenerative action of the positive feedback can be exercised in addition to the action of input transistors 34 and 35. In either case, the differential delay cell 40 flips in its opposite state with the gate of transistor 41 being higher in voltage than the gate of transistor 42. The trip point will be reached again when there is a voltage higher than one threshold between the gate of amplitude control transistor 36 and its terminal connected to the drain of transistor 41. This causes the amplitude control transistor 36 to conduct all or part of the drain current of transistor 34.

A differential delay cell 40 has been described above that utilizes a current source 31 for establishing an operating current. A differentially coupled transistor pair, i.e. transistors 34 and 35, have a common node coupled to the current source 31, two input nodes designated IP3 and IN3, and two output nodes designated as OP3 and ON3 that are coupled to load devices 48 and 49. Differential output signals are generated at the two output nodes in response to input signals coupled to the two input nodes. An amplitude control device 36 is coupled between the two output nodes for controlling an amplitude of the differential output signals being generated. The load devices 48 and 49 have a predetermined load impedance, and the operating current generated by the current source 31 is divided between the differentially coupled transistor pair and the load devices 48 and 49 in proportion to an input voltage applied to each of said two inputs nodes IP3 and IN3. The predetermined load impedances vary in magnitude in response to the operating current supplied.

It will be appreciated that the delay of the differential delay cell 40 in accordance with the present invention is predominantly determined by transistors 34 and 35 charging the combined capacitance connected to their drain nodes when the differential delay cell switches states. The delay is dependent on the value of the current from the cascode current source 31. When the output voltage amplitude of the differential delay cell 40 is kept constant for different values of current delivered from the cascode current source 31, the delay is linear and inversely proportional with the current delivered. This is due to the fact that the parasitic and load capacitance connected to the outputs ON3 and OP3 stay constant.

It will also be appreciated in accordance with the present invention that when the differential output voltage amplitude is kept relatively small, less time will be needed to charge and discharge the outputs OP3 and ON3. Hence the differential delay cell 40 will cause a smaller delay, and a ring oscillator employing the differential delay cell 40 so described will be able to oscillate at higher frequencies. Due to the fact that the limitation of the oscillation amplitude occurs at the lower rather then the higher level of the signal, it is possible to maintain the variable impedance load transistors in the active mode and even a regenerative mode of operation can be used.

The oscillation amplitude control and differential delay cell gain control in accordance with the present invention described above present a significant freedom of choice to the VCO oscillator designer. A wide variation of the diode and cross-coupled transistor size ratios can be used. For instance, a moderate size of cross-coupled transistor pair can be chosen just to enhance the differential delay cell gain and to provide a current drain to the differential delay cell outputs. The signal generated by the differential delay cell 40 will have a substantially sine wave form in this case. The diode-connected transistors can be eliminated, and only the cross-coupled transistors would constitute the differential delay cell load. In this case, the shape of the output signal of the differential delay cell will be substantially rectangular pulses. The optimal choice is dependent on the main target of the particular design.

Figure 5:
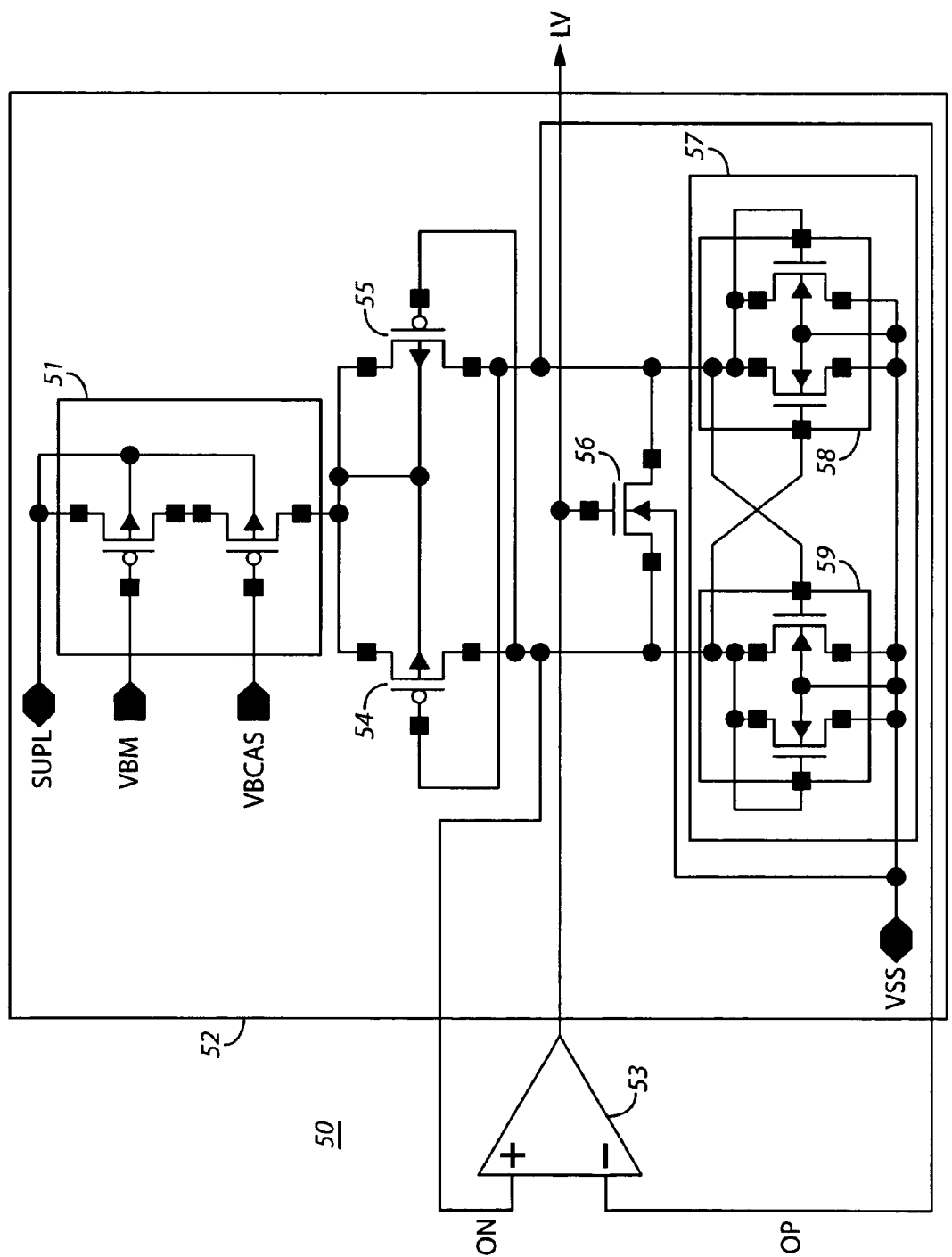
FIG. 5 is a simplified electrical diagram of control circuit for use with the differential delay cell in accordance certain embodiments of the present invention.

FIG. 5 is a simplified electrical diagram of a control circuit 50 for use with the differential delay cell in accordance with the present invention. FIG. 5 illustrates an arrangement for producing the gate control voltage LV applied to the gate of amplitude control transistor 36 described above. As shown, a differential delay cell is utilized which is a replica of the differential delay cell described in FIG. 4. The differential delay cell shown in FIG. 5 is herein after referred to as a replica differential delay cell 52. The differential delay cell 40 shown in FIG. 4, herein after referred to as a master differential delay cell, is designed to work in a ring-oscillator arrangement. Therefore the amplitude of the input voltage of the master differential delay cell has to be equal to the amplitude of the output voltage. This means the inputs of the replica differential delay cell 52 have to be connected to its outputs taking in consideration the appropriate polarity, e.g. the outputs ON and OP of the replica differential delay cell 52 are coupled to the gates of transistors 55 and 54, respectively. Replica amplitude control transistor 56, which is equivalent to the amplitude control transistor 36 of FIG. 4, is therefor forced to work under the same operating conditions as in the master differential delay cell. The gate voltage of replica amplitude control transistor 56 will then have the same influence both on the replica differential delay cell 52 and on the master differential delay cells. It will also be appreciated that the cascode current source 51 supplies the same current as the cascode current source 31 of FIG. 4.

A skewed operational amplifier 53 is the circuit element responsible for controlling the gate voltage of replica amplitude control transistor 56. The skewed operational amplifier 53 is connected in a negative feedback configuration with the replica differential delay cell 52, and measures the voltage difference between its positive and negative inputs which are connected to the replica differential delay cell outputs ON and OP, respectively. This measured voltage difference is constantly compared to an internal reference generated internally in the skewed operational amplifier 53, and provides information for adjusting the value of the gate voltage of the replica amplitude control transistor 56. The reference level is determined by the current through resistor 62 shown in FIG. 6 below, and that resistor's value. So, the ref level is $$\frac{I_{61}}{2} R_{62}$$

The control circuit 50 described above controls the differential delay cell 40 having differential outputs IP3 and IN3 generating differential output signals at differential outputs OP3 and ON3. The amplitude control device 36 controls the amplitude of the differential output signals in response to the control voltage LV described above. The control circuit 50 includes a replica differential delay cell 52 having two inputs, two outputs, and a replica amplitude control device 56. An amplifier 53 has differential inputs and an control output for providing a control voltage LV. The replica amplitude control device 56 is coupled between the two outputs of the replica differential delay cell 50, and the two inputs of the differential delay cell 50 are cross-coupled to the two outputs. The differential inputs of the amplifier 53 are coupled to the two outputs of said replica differential delay cell 52, and the control output is coupled to the input of replica amplitude control device 56. The control output is coupled to the amplitude control device 36 of the differential delay cell 40 for providing the control voltage LV for controlling the amplitude of the differential output signals that are generated.

Figure 6:
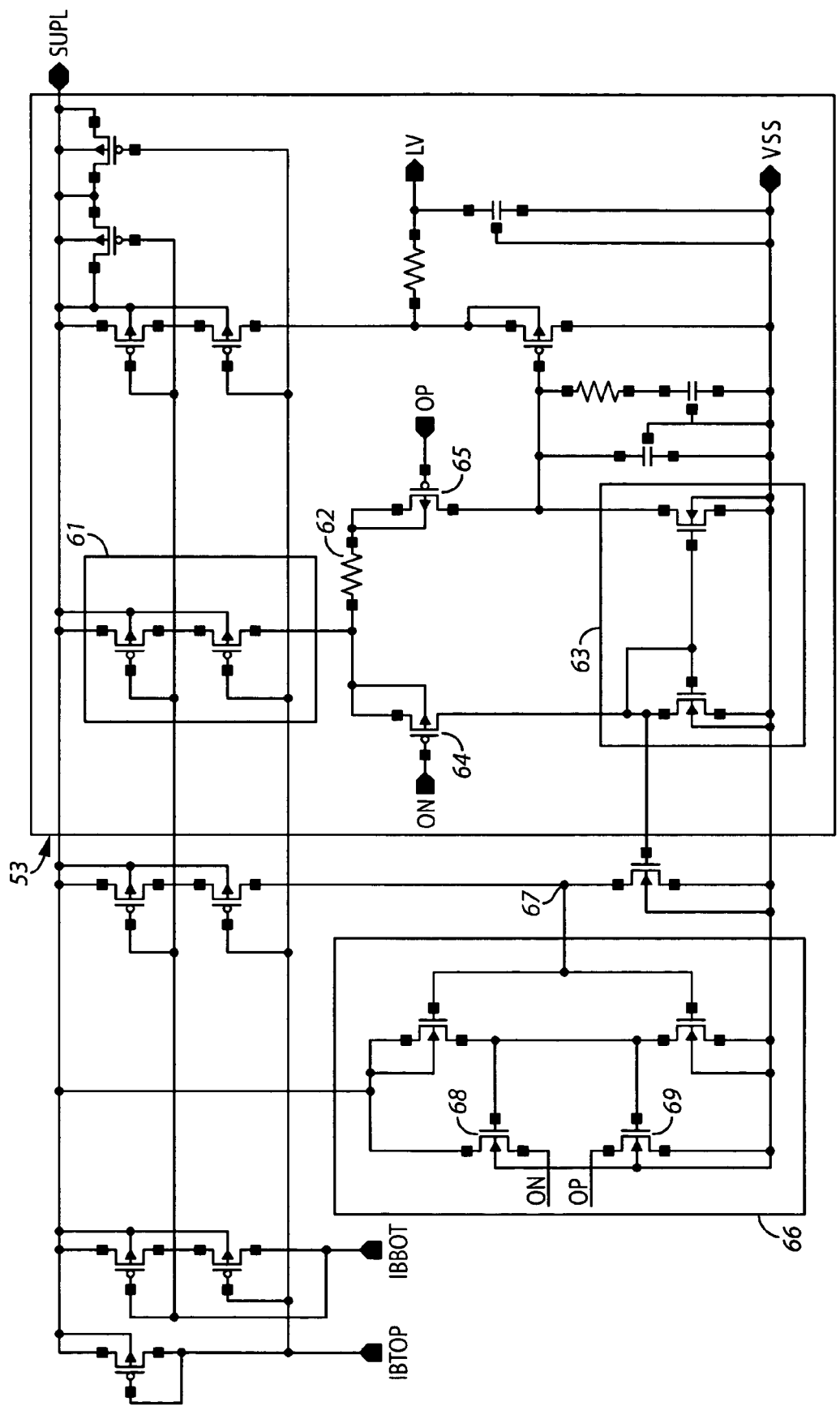
FIG. 6 is an electrical diagram of the operational amplifier of FIG. 5 in accordance with certain embodiments of the present invention.

FIG. 6 is an electrical diagram of the skewed operational amplifier 53 of FIG. 5 in accordance with the present invention. The skewed operational amplifier 53 is a differential input device working with an offset established by a resistor 62. A cascode current source 61 supplies the device with an operating current 2I. In the balanced state of operation the current mirror 63 forces the currents in the input transistors 64 and 65 to be the same and equal to I. This operating current I flows into the resistor 62 and establishes an input offset of I×R, where I is the magnitude of the operating current and R is the value of the resistor. The negative feedback described in relation to FIG. 5 adjusts the output voltage of the skewed operational amplifier 53 such that this offset is sustained, with the gate of transistor 65 being lower in voltage with respect to the gate of transistor 64.

The value of the offset can be set by choosing a value for the resistor 62 or the current of the cascode current source 61. For improved temperature independence of the offset and ultimately of the output voltage amplitude of the VCO differential delay cells, the operating current of the cascode current source 61 is designed to provide an inverse temperature characteristic compared to that of the resistor 62 in a manner well known to one of ordinary skill in the art.

The replica differential delay cell 52 of FIG. 5 is connected to operate as a latch. After initial power on, the replica differential delay cell 52 may latch with the outputs set to an incorrect polarity, i.e. output ON is lower in voltage than output OP. When this occurs, the output of the skewed operational amplifier 53 will be low and will fail to sufficiently turn on replica amplitude control transistor 56. When this occurs, the replica differential delay cell 52 will operate as a regenerative latch and no control of the outputs will be possible. An initialization circuit is provided which is coupled to the skewed operational amplifier 53. The initialization circuit is an inverter 66. When the gate of transistor 64 is lower than the gate of transistor 65, the output of the current mirror 63 coupled to the source of transistor 64 will move up in voltage, which will cause node 67 to go down. Node 67 is an input to the inverter 66, which under these conditions will force the gate of transistors 68 and 69 to go high. In response, the source of transistor 68 will be pulled up and the drain of transistor 69 will be pulled down, thereby forcing the correct polarity at the outputs of the replica differential delay cell 50 of FIG. 5.

The differential delay cell and amplitude control circuitry described above can serve as the basis for a ring oscillator, which is part of a PLL VCO.

Figure 7:
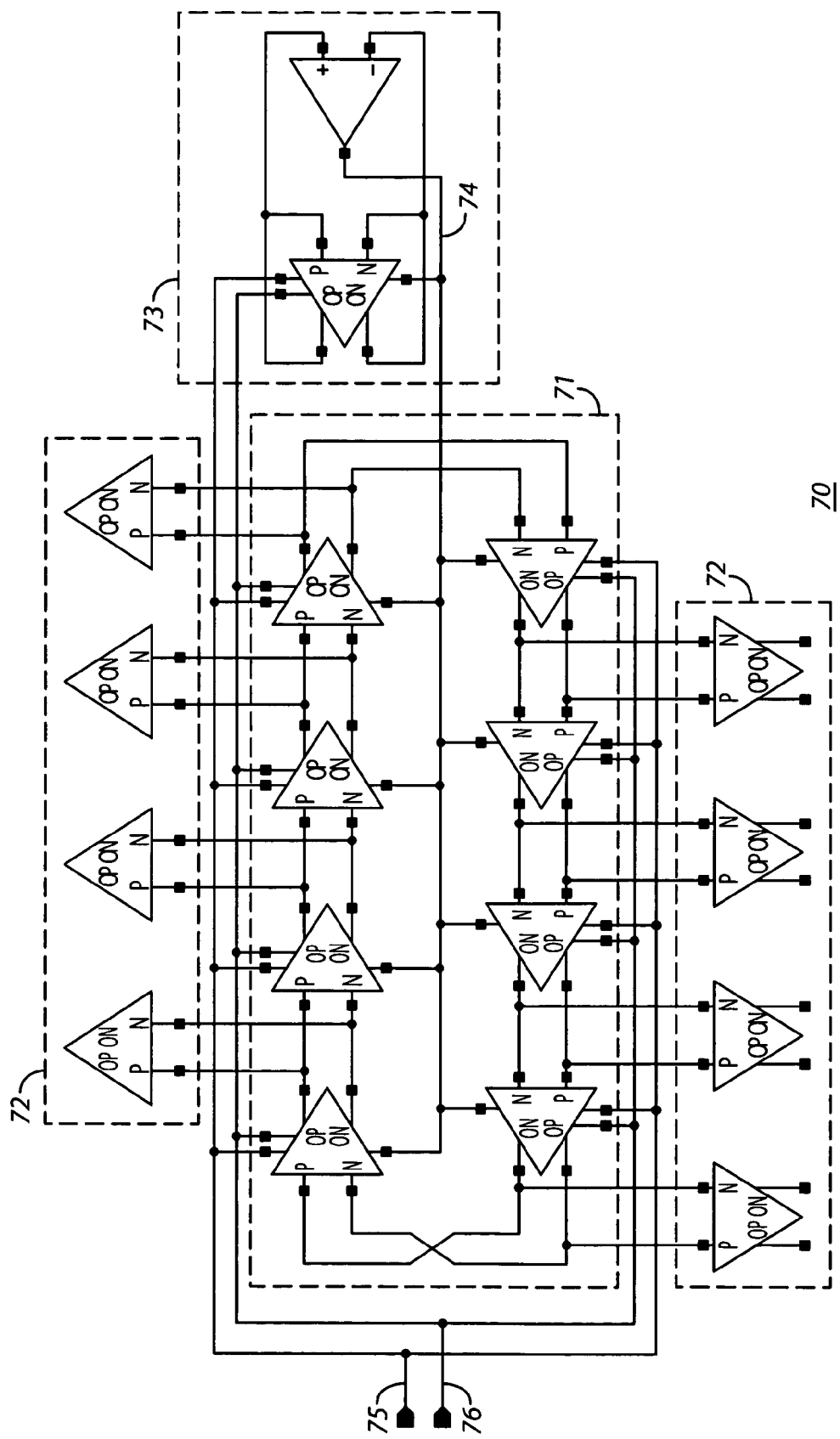
FIG. 7 is an electrical diagram of a VCO in accordance with certain embodiments of the present invention.

FIG. 7 is an electrical diagram of a VCO 70 in accordance with the present invention. A ring oscillator 71 is constructed using eight differential delay cells having amplitude control such as described in FIG. 4. The taps (differential outputs of the deferential delay cells) from the ring are coupled to inputs of buffer stages 72. The capacitive load present a the output of any differential delay cell connected in the oscillator ring is a summation of the following:

the input transistor capacitance of each of the buffer cells, the input transistor capacitance of the next differential delay cell in the oscillator ring, the output capacitance of the individual differential delay cell in the oscillator ring, and the parasitic capacitance associated with the conductors coupling the individual differential delay cell to the next differential delay cell and the corresponding buffer cell.

It will be appreciated that this capacitive load determines the delay time through the differential delay cell, and in combination with the number of delay cells in the oscillator ring determines the oscillation frequency in accordance with equation 1 presented above.

The frequency of the PLL VCO is controlled by the voltage supplied to input 76, which corresponds to input VBM in FIG. 4. Voltage input 75 corresponds to the VBCAS input of the differential delay cell as shown in FIG. 4 which is the bias of the cascode transistor in the cascode current source. An amplitude control voltage 74 is used to control the amplitude of oscillation within the differential delay cells, and is generated by an amplitude control circuit 73.

The amplitude control circuit 73 corresponds to the control circuit 50 described above. The amplitude control voltage 74 connects to the LV input of the differential delay cells 40 described above.

Figure 8:
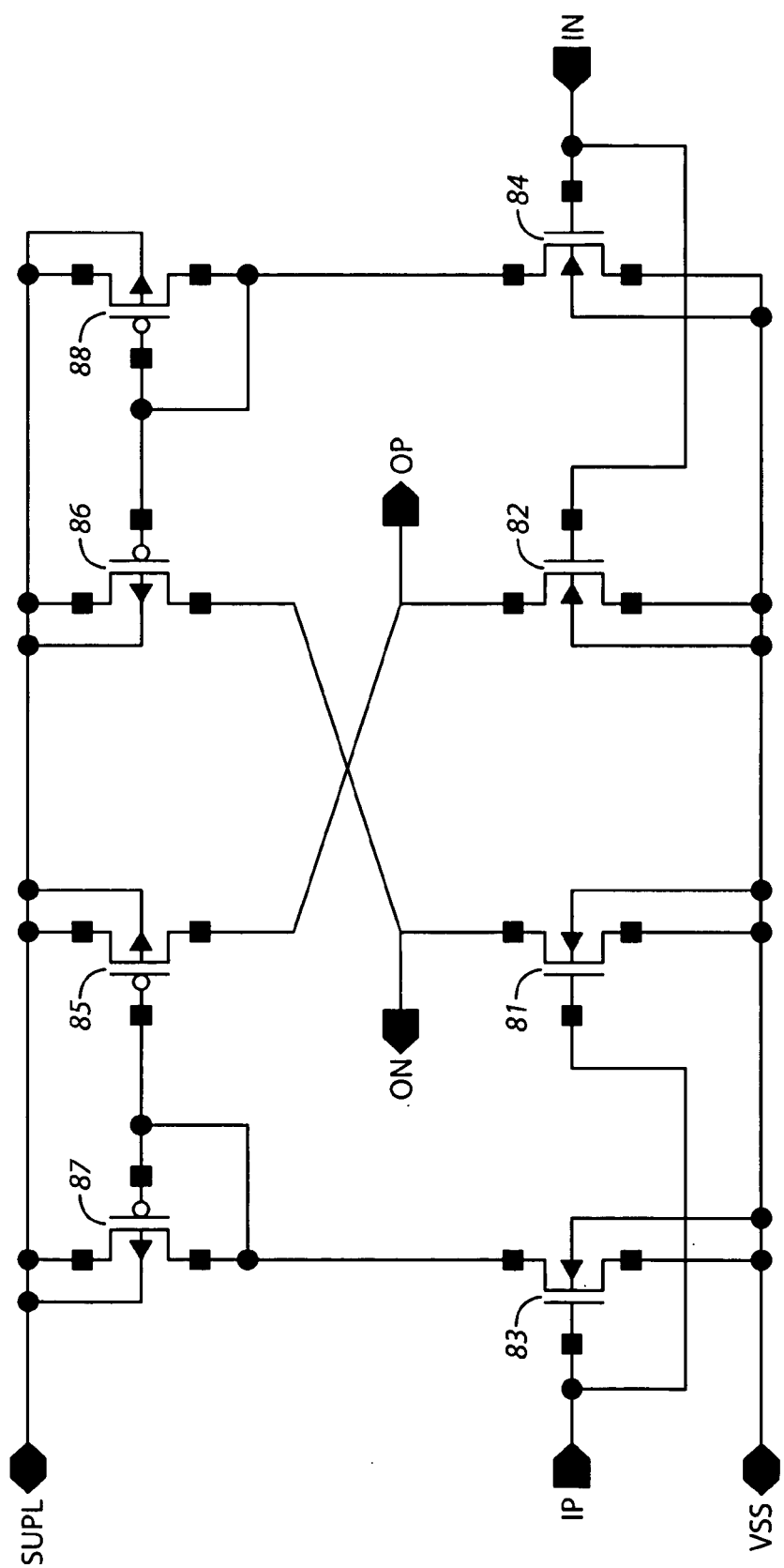
FIG. 8 is an electrical diagram of a load cell utilized with the differential delay cell in accordance with certain embodiments of the present invention.

FIG. 8 is an electrical diagram of a load cell 80 utilized with the differential delay cell in accordance with the present invention. The buffer configuration provided in FIG. 8 is by way of example, and it will be appreciated that other buffer configurations can be utilized as well in accordance with the present invention, Transistors 81 and 83 receive the voltage from the OP output of the respective differential delay cell connected to them, and transistors 81 and 83 receive the voltage from the ON output of the respective differential delay cell connected to them. For proper operation the size of transistors 81, 82, 83 and 84 have to match the size of transistors 41, 42, 43, and 44 from FIG. 4. The current of transistors 83 and 84 is mirrored through current mirrors 85–87 and 86–88, respectively. The currents of transistors 81 and 86 are compared at the output ON of the buffer. When the voltage at input IP is higher than the voltage at input IN, the current in transistor 81 would be greater compared to that of transistor 86 and the output ON will be pulled low toward VSS. In the same fashion the currents of transistors82 and 85 are compared at output OP and when output ON is pulled low, then output OP is pulled high. It will be appreciated that when required by the application, the outputs OP and ON of the buffer 80 can be further buffered before the outputs are delivered outside of the PLL VCO. It will also be appreciated that any additional buffers may not have the same supply as the buffer described in FIG. 8. Separating multiple buffer stages introduces less noise in the supply of the buffer 80 and differential delay cells of the oscillator ring 71 which needs to be as noise free as possible.

The present invention described above is implemented using a CMOS process. While the present invention described above is ideally suited for a low voltage CMOS process implementation, the present invention can provide improvements in performance using CMOS processes operating at higher voltages as well.

We claim:

1. A differential delay cell comprising:
   a cascade current source for establishing an operating current, wherein said cascade current source has a first input for controlling the magnitude of the operating current generated;
   a differentially coupled transistor pair having a common node, two input nodes, and two output nodes,
   said common node being coupled to said current source, and said two output nodes being coupled to load devices, wherein differential output signals are generated at said two output nodes in response to input signals coupled to said two input nodes, said load devices have a predetermined load impedance, and further wherein the operating current generated by said current source is divided between said differentially coupled transistor pair and said load devices in proportion to an input voltage applied to each of said two inputs nodes, and further wherein the predetermined load impedance varies in magnitude in response to the operating current applied thereto, and
   an amplitude control device coupled between said two output nodes for controlling an amplitude of the differential output signals being generated.

2. The differential delay cell according to claim 1, wherein said load devices have a predetermined load impedance, and further wherein the operating current generated by said current source is divided between said differentially coupled transistor pair and said load devices in proportion to an input voltage applied to each of said two inputs nodes, and further wherein the predetermined load impedance varies in magnitude in response to the operating current supplied thereto.

3. The differential delay cell according to claim 2, wherein said load devices comprise cross-coupled transistors coupled to said two outputs nodes and ground.

4. The differential delay cell according to claim 3, wherein switching of said differentially coupled transistor pair generates differential output signal having a substantially square wave pattern.

5. The differential delay cell according to claim 1, wherein said amplitude control device has a control input that is coupled to a control voltage, and further wherein the control voltage controls the amplitude of the differential output signals being generated.

6. The differential delay cell according to claim 5, wherein the control voltage is variable and further wherein the amplitude of the differential output signals varies in accordance with the control voltage supplied.

7. The differential delay cell according to claim 2, wherein said current source is a cascode current source for generating the operating current, and wherein said cascode current source has a first input for controlling the magnitude of the operating current generated.

8. The differential delay cell according to claim 1, wherein the differential delay cell is implemented using CMOS process.

9. The differential delay cell according to claim 8, wherein said amplitude control device is a MOS transistor having a gate, a source, and a drain, and wherein said gate of said MOS transistor is connected to the control voltage, and further wherein said source and drain are connected to said output nodes of the differential delay cell.

10. A differential delay cell comprising:
    a cascode current source for establishing an operating current,
    a differentially coupled transistor pair having a common node, two input nodes, and two output nodes,
    said common node being coupled to said current source, and said two output nodes being coupled to load devices, wherein differential output signals are generated at said two output nodes in response to input signals coupled to said two input nodes, said load devices have a predetermined load impedance, and further wherein the operating current generated by said current source is divided between said differentially coupled transistor pair and said load devices in proportion to an input voltage applied to each of said two inputs nodes, and further wherein the predetermined load impedance varies in magnitude in response to the operating current applied thereto, and
    an amplitude control device coupled between said two output nodes for controlling an amplitude of the differential output signals being generated,
    wherein said load devices comprise diode-connected transistors coupled to each of said cross-coupled transistors and ground.

11. The differential delay cell according to claim 5, wherein switching of said differentially coupled transistor pair generates differential output signals having a substantially sine wave pattern.

12. A differential delay cell comprising:
    a cascode current source for establishing an operating current,
    a differentially coupled transistor pair having a common node, two input nodes, and two output nodes, said common node being coupled to said current source, and said two output nodes being coupled to load devices, wherein differential output signals are generated at said two output nodes in response to input signals coupled to said two input nodes, said load devices have a predetermined load impedance, and further wherein the operating current generated by said current source is divided between said differentially coupled transistor pair and said load devices in proportion to an input voltage applied to each of said two inputs nodes, and further wherein the predetermined load impedance varies in magnitude in response to the operating current applied thereto, and an amplitude control device coupled between said two output nodes for controlling an amplitude of the differential output signals being generated, wherein said load devices comprise diode-connected transistors coupled to each of said output nodes and ground.

13. A control circuit for controlling a differential delay cell having differential outputs generating differential output signals, and an amplitude control device for controlling an amplitude of the differential output signals in response to a control voltage applied thereto, the control circuit comprising:

a replica differential delay cell having two inputs, two outputs, and a replica amplitude control device; and an amplifier having differential inputs and a control output, wherein said replica amplitude control device is coupled between said two outputs, and further wherein said two inputs are cross-coupled to said two outputs of said replica differential delay cell; and further wherein said differential inputs of said amplifier are coupled to said two outputs of said replica differential delay cell, and said control output is coupled to an input of said replica amplitude control device, said control output being further coupled to the amplitude control device of the differential delay cell for providing the control voltage for controlling the amplitude of the differential output signals being generated.

14. The control circuit for controlling a differential delay cell according to claim 13 wherein said amplifier is connected in a negative feedback configuration with said replica differential delay cell, and wherein said amplifier measures a voltage difference between said differential inputs for generating the control voltage.

15. The control circuit for controlling a differential delay cell according to claim 13, wherein said amplifier comprises an offset generating device, said offset generating device introduces additional voltage difference to the amplifier differential inputs.

16. The control circuit for controlling a differential delay cell according to claim 14 wherein the additional voltage difference introduced by the offset generating device is substantially equal to the desired amplitude of the differential signal generated by the replica delay cell.

17. The control circuit for controlling a differential delay cell according to claim 13, wherein said replica differential delay cell comprises a replica current source having a replica control input for establishing an operating current therein, and further where the differential delay cell comprises a current source having a control input for establishing an operating current therein, said replica control input of said replica differential delay cell and the control input of the differential delay cell being coupled to receive a current control input.

18. The control circuit for controlling a differential delay cell according to claim 13, wherein said replica differential delay cell further comprises a replica load devices providing a variable impedance, the operating current established by said current control input controls a magnitude of impedance set by said replica load devices, and the magnitude of the impedance of said replica load devices is equal to the magnitude of the impedance of the load devices of the differential delay cell.

19. The control circuit for controlling a differential delay cell according to claim 13 further comprising an initialization circuit for initializing a state in which said replica differential delay cell is set on power-up.

20. The control circuit for controlling a differential delay cell according to claim 19 wherein said initialization circuit allows for said replica differential delay cell to be latched in one state and does not allow for said replica differential delay cell to be latched in an other state.

21. The control circuit for controlling a differential delay cell according to claim 19, wherein said initialization circuit comprises an inverter.

22. The control circuit of claim 13, wherein the control circuit is implemented using CMOS technology.

23. A ring oscillator comprising:

a plurality of differential delay cells coupled into an oscillator ring, delay through each of said plurality of differential delay cells determining a frequency of oscillation of the ring oscillator, each of said plurality of differential delay cells having a pair of inputs which couple from a pair of outputs of a preceding differential delay cell, and having an amplitude control device coupled between said pair of outputs, said amplitude control device having an input responsive to a control voltage for controlling an amplitude of oscillation; and a control circuit including a replica differential delay cell for generating the control signal for controlling the amplitude of oscillation of the each of said plurality of differential delay cells.

24. The ring oscillator according to claim 23 wherein said plurality of differential delay cells and said replica differential delay cell comprises:

a current source for generating an operating current therein, said current source having an input responsive to a control signal for establishing the operating current being generated, a differentially coupled transistor pair having a common node, two input nodes, and two output nodes, said common node being coupled to said current source, and said two output nodes being coupled to load devices, wherein differential output signals are generated at said two output nodes in response to input signals coupled to said two input nodes, and an amplitude control device coupled between said two output nodes, and responsive to the control voltage for controlling the amplitude of oscillation of the differential outputs signals being generated.

25. The ring oscillator according to claim 24, wherein said load devices have a predetermined load impedance, and further wherein the operating current generated by said current source is divided between said differentially coupled transistor pair and said load devices in proportion to an input voltage applied to each of said two inputs nodes, whereby the predetermined load impedance varies in magnitude in response to the operating current supplied thereto, which establishes the frequency of oscillation of the ring oscillator.

26. The ring oscillator according to claim 23, further comprising a plurality of buffers each coupled to one of said plurality of differential delay cells, said plurality of buffers isolating said plurality of differential delay cells from loading.

27. The ring oscillator according to claim 23, wherein the ring oscillator is implemented using CMOS technology.

28. The ring oscillator according to claim 27, wherein said amplitude control device is a MOS transistor, the gate of said MOS transistor is connected to the control voltage and the source and drain nodes are connected to the output nodes of said plurality of differential delay cells.

* * * * *